(12) United States Patent
Jeong et al.

(10) Patent No.: US 12,405,314 B2
(45) Date of Patent: Sep. 2, 2025

(54) BATTERY DIAGNOSIS APPARATUS, BATTERY DIAGNOSIS METHOD AND BATTERY DIAGNOSIS SYSTEM

(71) Applicant: LG ENERGY SOLUTION, LTD., Seoul (KR)

(72) Inventors: Hee-Seok Jeong, Daejeon (KR); Yoon-Jung Bae, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/876,648

(22) PCT Filed: Jun. 9, 2023

(86) PCT No.: PCT/KR2023/007956
§ 371 (c)(1),
(2) Date: Dec. 18, 2024

(87) PCT Pub. No.: WO2023/249298
PCT Pub. Date: Dec. 28, 2023

(65) Prior Publication Data
US 2025/0258242 A1 Aug. 14, 2025

(30) Foreign Application Priority Data

Jun. 20, 2022 (KR) .................. 10-2022-0075198
Jun. 7, 2023 (KR) .................. 10-2023-0072881

(51) Int. Cl.
*G06F 11/30* (2006.01)
*G01R 31/3842* (2019.01)
*G01R 31/392* (2019.01)

(52) U.S. Cl.
CPC ....... *G01R 31/392* (2019.01); *G01R 31/3842* (2019.01)

(58) Field of Classification Search
CPC .................................................. G01R 31/392
See application file for complete search history.

(56) References Cited

U.S. PATENT DOCUMENTS

| 2001/0022518 A1 | 9/2001 | Asakura et al. |
| 2003/0169017 A1 | 9/2003 | Ariga et al. |

(Continued)

FOREIGN PATENT DOCUMENTS

| EP | 3591756 A1 | 1/2020 |
| JP | 10145979 A | 5/1998 |

(Continued)

*Primary Examiner* — Phuong Huynh
(74) *Attorney, Agent, or Firm* — BRYAN CAVE LEIGHTON PAISNER LLP

(57) ABSTRACT

A battery diagnosis apparatus, a battery diagnosis method and a battery diagnosis system are disclosed. The battery diagnosis apparatus includes a data acquisition unit configured to acquire battery information indicating a time-dependent change history of a terminal voltage and a charge current of a battery during a reference number of charge cycles performed according to a Constant Current (CC)-Constant Voltage (CV) charging protocol for the battery at beginning of life (BOL). The apparatus also includes a control unit configured to calculate an initial CC capacity ratio for each charge cycle of the reference number of charge cycles performed based on the battery information. A first initial CC capacity ratio in a first charge cycle is a ratio of a first CC charge capacity to a total charge capacity of the battery in the first charge cycle, and the first CC charge capacity is a charge capacity in a first CC charging duration according to the CC-CV charging protocol. The control unit is configured to determine a representative initial CC capacity ratio based on each initial CC capacity ratio of each charge cycle of the reference number of charge cycles; an diagnose the battery by determining an indication of accelerated degradation by comparing the representative initial (Continued)

CC capacity ratio with a predetermined representative reference CC capacity ratio.

15 Claims, 12 Drawing Sheets

(56) References Cited

U.S. PATENT DOCUMENTS

| | | |
|---|---|---|
| 2010/0201323 A1 | 8/2010 | Okamura |
| 2012/0007564 A1 | 1/2012 | Muraoka et al. |
| 2014/0156209 A1 | 6/2014 | Yuan et al. |
| 2014/0225570 A1 | 8/2014 | Suga et al. |
| 2015/0115969 A1 | 4/2015 | Ishida et al. |
| 2016/0003917 A1 | 1/2016 | You et al. |
| 2016/0336763 A1 | 11/2016 | Khandelwal et al. |
| 2017/0294689 A1 | 10/2017 | Wada et al. |
| 2020/0328608 A1 | 10/2020 | Song et al. |
| 2020/0408848 A1 | 12/2020 | Chung et al. |
| 2022/0140636 A1 | 5/2022 | Yasugi |
| 2022/0200305 A1 | 6/2022 | Song et al. |
| 2023/0366936 A1 | 11/2023 | Kurauchi et al. |

FOREIGN PATENT DOCUMENTS

| | | | | |
|---|---|---|---|---|
| JP | 2001-332310 A | 11/2001 | | |
| JP | 3979628 B2 | 9/2007 | | |
| JP | 4983818 B2 | 7/2012 | | |
| JP | 2012221788 A | 11/2012 | | |
| JP | 5521298 B2 | 6/2014 | | |
| JP | 201833277 A | 3/2018 | | |
| JP | 2018-073777 A | 5/2018 | | |
| JP | 201913109 A | 1/2019 | | |
| JP | 202064828 A | 4/2020 | | |
| JP | 2020064828 A | * | 4/2020 | ......... G01R 31/3835 |
| KR | 10-2014-0042909 A | 4/2014 | | |
| KR | 10-2016-0004077 A1 | 1/2016 | | |
| KR | 20160004077 A | * | 1/2016 | |
| KR | 10-2016-0134572 A | 11/2016 | | |
| KR | 10-2017-0116816 A | 10/2017 | | |
| KR | 10-2018-0005345 A | 1/2018 | | |
| KR | 20180005345 A | * | 1/2018 | |
| WO | 2011-070748 A1 | 6/2011 | | |
| WO | 2013128635 A1 | 9/2013 | | |
| WO | 2015-198631 A1 | 12/2015 | | |
| WO | 2019-172692 A1 | 9/2019 | | |
| WO | 2022080377 A1 | 4/2022 | | |

* cited by examiner

BATTERY DIAGNOSIS APPARATUS, BATTERY DIAGNOSIS METHOD AND BATTERY DIAGNOSIS SYSTEM

CROSS-REFERENCE TO RELATED APPLICATION

This application is a National Phase entry pursuant to 35 U.S.C. 371 of International Application No. PCT/KR2023/007956 filed on Jun. 9, 2023, which claims priority to and the benefit of Korean Patent Application No. 10-2022-0075198 filed on Jun. 20, 2022 and Korean Patent Application No. 10-2023-0072881 filed on Jun. 7, 2023 in the Republic of Korea, the disclosures of which are incorporated herein by reference in their entireties.

TECHNICAL FIELD

The present disclosure relates to a battery diagnosis apparatus and method, and more particularly, to early diagnosis of abnormal degradation of a battery.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

In general, a battery degrades with use, and it is necessary to accurately determine the condition of the battery to accurately estimate State Of Charge (SOC) and State Of Health (SOH) of the degraded battery, or take control for increasing the life of the degraded battery.

In particular, in order to effectively increase the life of the battery, it requires control to prevent accelerated degradation of the battery.

The background description provided herein is for the purpose of generally presenting context of the disclosure. Unless otherwise indicated herein, the materials described in this section are not prior art to the claims in this application and are not admitted to be prior art, or suggestions of the prior art, by inclusion in this section.

SUMMARY

The present disclosure is designed to solve the above-described problem, and therefore the present disclosure is directed to providing a battery diagnosis apparatus, a battery diagnosis method and a battery diagnosis system for early diagnosis of abnormal rapid degradation of a battery based on charging capacity information (information indicating Constant Current (CC) charging capacity and CC charging capacity) acquired for charge cycles using a CC-Constant Voltage (CV) charging protocol of the battery.

The present disclosure is further directed to providing a battery diagnosis apparatus, a battery diagnosis method and a battery diagnosis system for adjusting a cut-off voltage that is the reference of change from a CC charging stage to a CV charging stage to suppress accelerated degradation of the battery when the sign of abnormal rapid degradation of the battery is identified.

These and other objectives and advantages of the present disclosure may be understood by the following description and will be apparent from an embodiment of the present disclosure. In addition, it will be readily understood that the objectives and advantages of the present disclosure may be realized by the means set forth in the appended claims and a combination thereof.

A battery diagnosis apparatus according to an aspect of the present disclosure includes a data acquisition unit configured to acquire battery information indicating a time-dependent change history of a terminal voltage and a charge current of a battery during a reference number of charge cycles performed according to a Constant Current (CC)-Constant Voltage (CV) charging protocol for the battery at beginning of life (BOL), and a control unit configured to calculate an initial CC capacity ratio for each charge cycle of the reference number of charge cycles performed based on the battery information. The initial CC capacity ratio in a first charge cycle is a ratio of a first CC charge capacity to a total charge capacity of the battery in the first charge cycle, and the first CC charge capacity is a charge capacity in a first CC charging duration according to the CC-CV charging protocol. The control unit is configured to determine a representative initial CC capacity ratio based on each initial CC capacity ratio of each charge cycle of the reference number of charge cycles, and diagnose the battery by determining an indication of accelerated degradation by comparing the representative initial CC capacity ratio with a predetermined representative reference CC capacity ratio.

The control unit may be configured to determine the indication of accelerated degradation when the representative initial CC capacity ratio is larger than the predetermined representative reference CC capacity ratio.

The control unit may be configured to adjust a cut-off voltage of the CC-CV charging protocol in response to determining the indication of accelerated degradation. The cut-off voltage is a voltage which is a reference for a change event from a CC charging stage to a CV charging stage.

The control unit may be configured to, in response to determining the indication of accelerated degradation, calculate a capacity ratio deviation indicating a difference between the representative initial CC capacity ratio and the representative reference CC capacity ratio. The control unit may be configured to adjust the cut-off voltage based on the capacity ratio deviation.

The control unit may be configured to determine a target State of Charge (SOC) based on a reference State Of Charge (SOC) and the capacity ratio deviation. The reference SOC is mapped to a reference cut-off voltage recorded in a predetermined reference SOC profile indicating a correlation between a State of Charge (SOC) and Closed Circuit Voltage (CCV). The control unit may be configured to adjust the cut-off voltage to be equal to the CCV mapped to the target SOC in the predetermined reference SOC profile.

The control unit may be configured to determine the target SOC by subtracting the capacity ratio deviation from the reference SOC.

When the reference number is 2 or greater, the control unit may be configured to calculate the representative initial CC capacity ratio to be equal to an average or a median of a plurality of initial CC capacity ratios having the same number of initial CC capacity ratios as the reference number.

The control unit may be configured to, for each charge cycle, determine the CC charge capacity in each charge cycle by accumulating a current value of the charge current for each CC charging duration of each charge cycle according to the CC-CV charging protocol, determine a CV charge capacity of each charge cycle by accumulating a current value of the charge current for each CV charging duration of each charge cycle according to the CC-CV charging protocol, and determine the total charge capacity by summing the CC charge capacity and the CV charge capacity of each charge cycle.

The control unit may be configured to calculate a capacity ratio deviation indicating a difference between the representative initial CC capacity ratio and the representative reference CC capacity ratio in response to determining the indication of accelerated degradation. The control unit may be configured to select a voltage adjustment scheduling curve associated with the calculated capacity ratio deviation from a plurality of preset voltage adjustment scheduling curves associated with a plurality of capacity ratio deviations in a one-to-one relationship. The voltage adjustment scheduling curve defines a change in voltage adjustment value with increasing cycle count. The control unit may be configured to determine a cut-off voltage of the CC-CV charging protocol using the selected voltage adjustment scheduling curve each time the cycle count of the charge cycle increases. The cut-off voltage may be a reference voltage for a change event from a CC charging stage to a CV charging stage.

A battery diagnosis system according to another aspect of the present disclosure includes the battery diagnosis apparatus.

A battery diagnosis method according to still another aspect of the present disclosure includes acquiring battery information indicating a time-dependent change history of a terminal voltage and a charge current of a battery during a reference number of charge cycles performed according to a Constant Current (CC)-Constant Voltage (CV) charging protocol for the battery at BOL, calculating an initial CC capacity ratio for each charge cycle of the reference number of charge cycles performed based on the battery information, wherein a first initial CC capacity ratio in a first charge cycle is a ratio of a CC charge capacity to a total charge capacity of the battery in the first charge cycle, and the first CC charge capacity is a charge capacity in a first CC charging duration according to the CC-CV charging protocol, determining a representative initial CC capacity ratio based on each initial CC capacity ratio of each charge cycle of the reference number of charge cycles, and diagnosing the battery by determining an indication of accelerated degradation by comparing the representative initial CC capacity ratio with a predetermined representative reference CC capacity ratio.

The determining of the indication of accelerated degradation may include diagnosing that the battery has sign of accelerated degradation when the representative initial CC capacity ratio is larger than the predetermined representative reference CC capacity ratio.

The battery diagnosis method may further include adjusting a cut-off voltage of the CC-CV charging protocol in response to determining the indication of accelerated degradation. The cut-off voltage may be a reference voltage for a change event from a CC charging stage to a CV charging stage.

The adjusting of the cut-off voltage of the CC-CV charging protocol may include, in response to determining the indication of accelerated degradation, calculating a capacity ratio deviation indicating a difference between the representative initial CC capacity ratio and the representative reference CC capacity ratio, and adjusting the cut-off voltage based on the capacity ratio deviation.

The adjusting of the cut-off voltage based on the capacity ratio deviation may include determining a target SOC based on a reference SOC and the capacity ratio deviation, and adjusting the cut-off voltage to the equal to the CCV mapped to the target SOC in the reference SOC profile. The reference SOC is mapped to a reference cut-off voltage recorded in a predetermined reference SOC profile indicating a correlation between a State of Charge (SOC) and Closed Circuit Voltage (CCV).

According to at least one of the embodiments of the present disclosure, it may be possible to achieve early diagnosis of whether the battery will show abnormally rapid degradation in the future based on the charging capacity information (information indicating CC charging capacity and CC charging capacity) acquired for charge cycles using the Constant Current (CC)-Constant Voltage (CV) charging protocol of the battery.

Additionally, according to at least one of the embodiments of the present disclosure, it may be possible to adjust the cut-off voltage that is the reference of change from the CC charging stage to the CV charging stage when the sign of abnormal rapid degradation of the battery is identified, thereby suppressing accelerated degradation of the battery.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate exemplary embodiments of the present disclosure and together with the following detailed description, serve to provide a further understanding of the technical aspect of the present disclosure, and thus the present disclosure should not be construed as being limited to the drawings.

DETAILED DESCRIPTION

Figure 1:
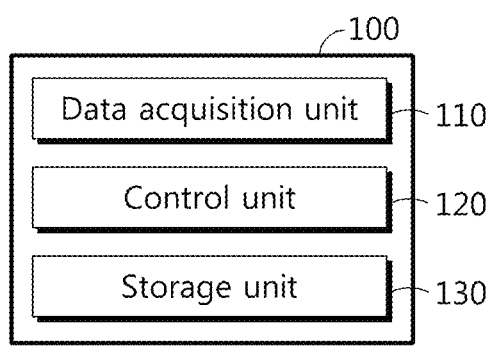
FIG. 1 is a diagram schematically showing a battery diagnosis apparatus according to an embodiment of the present disclosure.

It should be understood that the terms or words used in the specification and the appended claims should not be construed as being limited to general and dictionary meanings, but rather interpreted based on the meanings and concepts corresponding to the technical aspect of the present disclosure on the basis of the principle that the inventor is allowed to define the terms appropriately for the best explanation.

Therefore, the embodiments described herein and the illustrations shown in the drawings are exemplary embodiments of the present disclosure to describe the technical aspect of the present disclosure and are not intended to be limiting, so it should be understood that a variety of other equivalents and modifications could have been made thereto at the time that the application was filed.

Additionally, in describing the present disclosure, when it is determined that a certain detailed description of relevant known elements or functions may cause obscurity in the subject matter of the present disclosure, its detailed description is omitted.

The terms including the ordinal number such as "first", "second" and the like, are used to distinguish one element from another among various elements, but not intended to limit the elements.

Unless the context clearly indicates otherwise, the term "comprises" when used in this specification, specifies the presence of stated elements, but does not preclude the presence or addition of one or more other elements.

Additionally, the term "control unit" as used herein refers to a processing unit of at least one function or operation, and may be implemented in hardware and software either alone or in combination.

In addition, throughout the specification, it should be understood that when an element is referred to as being "connected to" another element, it can be directly connected to the other element or intervening elements may be present.

Hereinafter, exemplary embodiments of the present disclosure will be described in detail with reference to the accompanying drawings.

FIG. 1 is a diagram schematically showing a battery diagnosis apparatus 100 according to an embodiment of the present disclosure.

Referring to FIG. 1, the battery diagnosis apparatus 100 may include a data acquisition unit 110 and a control unit 120. The battery diagnosis apparatus 100 may further include a storage unit 130.

The data acquisition unit 110 may acquire battery information including a terminal voltage and a charge current of a battery measured during charging of the battery using a Constant Current (CC)-Constant Voltage (CV) charging protocol. The terminal voltage of the battery refers to a voltage across two terminals (a positive terminal and a negative terminal) of the battery.

Here, the CC-CV charging protocol refers to a charging process including a CC charging stage and a CV charging stage in a sequential order, and may be simply referred to as a 'charge cycle'.

A duration from a start time to an end time of the CC charging stage may be referred to as a 'CC charging duration'. A duration from a start time to an end time of the CV charging stage may be referred to as a 'CV charging duration'. The end time of the CC charging stage may match the start time of the CV charging stage.

The data acquisition unit 110 may be configured to acquire the battery information including voltage V and capacity Q of the battery to be diagnosed (hereinafter referred to as 'diagnostic target battery').

Here, the diagnostic target battery refers to a physically separable independent cell having the negative terminal and the positive terminal. For example, a lithium ion cell or a lithium polymer cell may be regarded as the battery. Additionally, the battery may refer to a cell group including a plurality of cells connected in series and/or in parallel.

Figure 8:
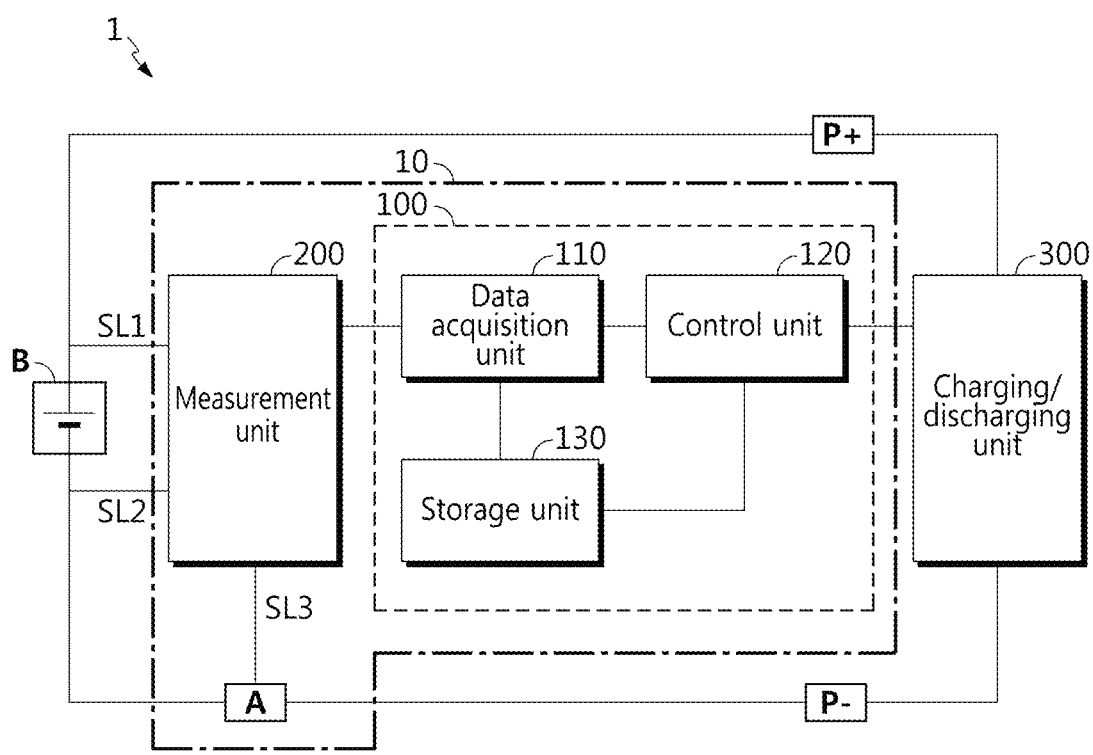
FIG. 8 is a diagram schematically showing the exemplary setup of a high level equipment including a battery diagnosis apparatus according to an embodiment of the present disclosure.

According to embodiments, the data acquisition unit 110 may acquire the battery information (a voltage value of the terminal voltage) measured by a measurement unit (see 200 in FIG. 8) connected to the positive electrode and the negative electrode of the battery through a pair of voltage sensing lines (see SL1, SL2 in FIG. 8).

Additionally, the measurement unit 200 may be connected to a current sensor (see A in FIG. 8) that measures a current of the battery through a current sensing line SL3, and the data acquisition unit 110 may acquire a current value of the charge current measured by the current sensor A through the measurement unit 200.

According to embodiments, the data acquisition unit 110 may be configured to communicate with an external device. The data acquisition unit 110 may receive the battery information from the external device using communication.

The control unit 120 and the data acquisition unit 110 may be wiredly and/or wirelessly connected to each other to enable communication between them. Additionally, the control unit 120 may receive the battery information from the data acquisition unit 110 via a wired line and/or a wireless communication network.

When the battery to be diagnosed is at Beginning Of Life (BOL), the control unit 120 may calculate an initial CC capacity ratio of the battery based on the battery information acquired from the data acquisition unit 110. The BOL may refer to a state of a battery showing little or no degradation caused by charging and discharging like a state of a battery at the production time or delivery time.

The initial CC capacity ratio is based on a charge capacity acquired for the CC charging duration of each charge cycle in a predetermined reference number of repeated charge cycles of the battery at BOL.

The reference number that is the number of charge cycles set to be repeatedly performed to calculate the initial CC capacity ratio may be preset to one or more. For example, the reference number may be set to five.

In the case where the reference number is one, a CC capacity ratio calculated in the initial charge cycle for the battery at BOL may be set as a representative initial CC capacity ratio.

When the reference number is n (n is a natural number of 2 or greater), first to n-th initial CC capacity ratios associated in a one-to-one relationship with the reference number of first to n-th charge cycles for the battery at BOL may be calculated. The representative value of the first to n-th initial CC capacity ratios may be referred to as 'representative initial CC capacity ratio'.

The period until the cycle count of the charge cycle for the battery (i.e., the diagnostic target battery) at BOL reaches the reference number may be referred to as 'diagnostic observation duration'. The cycle count indicates the sequence of the charge cycle. For example, the current cycle count being x represents that the battery went through a total of x cycles from BOL.

In an embodiment, the charge cycle may refer to a charging process of performing the CC charging stage on the battery from the time when the terminal voltage of the battery is equal to or lower than the lower limit (start-of-charge voltage) of a preset charging voltage range, changing to the CV charging stage when the terminal voltage of the battery reaches the upper limit (end-of-charge voltage) of the charging voltage range, and stopping charging when the charge current of the battery is reduced down to the reference current (for example, 0.005 A). During the charge cycle, it is desirable to keep the temperature of the battery or the outdoor temperature constant.

The charge cycle may be included in a charge/discharge cycle together with a discharge cycle. The discharge cycle may refer to a process of stabilizing the battery for a predetermined time after the charge cycle is completed, discharging the battery from the upper limit (start-of-discharge voltage) to the lower limit (end-of-discharge voltage) of a preset discharging voltage range and stopping discharging. The magnitude of the discharge current in the discharge cycle may be preset to be equal to or smaller than the magnitude of the charge current in the charge cycle. In the same way as the charge cycle, it is desirable to keep the temperature of the battery or the outdoor temperature constant during the discharge cycle.

The charging voltage range and the discharging voltage range may be equal or different. However, preferably, for charge/discharge cycles, the charging voltage ranges of the charge cycles are equal to each other and the discharging voltage ranges of the discharge cycles are also equal to each other.

In another embodiment, the discharge cycle refers to the process that starts discharging from the upper limit of the preset discharging voltage range and stops discharging when a cumulative discharge current reaches a preset discharge capacity. Preferably, for charge/discharge cycles, the charging voltage ranges of the charge cycles are equal to each other and the discharge capacities of the discharge cycles are equal to each other.

The control unit 120 may calculate a CC charge capacity, a CV charge capacity and/or a total charge capacity per charge cycle using the current value (the measured charge current value) included in the battery information acquired from the data acquisition unit 110.

The control unit 120 may calculate the initial CC capacity ratio by comparing the total charge capacity with the CC charge capacity in each charge cycle performed the reference number of times.

Here, when the battery at BOL go through a plurality of charge cycles, the representative value of the plurality of initial CC capacity ratios in the plurality of charge cycles may be set as the representative initial CC capacity ratio as described above. For example, the representative initial CC capacity ratio may be the average or median of the plurality of initial CC capacity ratios. That is, the representative initial CC capacity ratio may include any value that represents the plurality of initial CC capacity ratios among values calculated by processing the plurality of initial CC capacity ratios without limitation.

The control unit 120 may be configured to set (adjust) a cut-off voltage for the battery based on a result of comparing the representative initial CC capacity ratio with a representative reference CC capacity ratio. Here, the cut-off voltage may refer to a voltage at the end of the CC charging stage (i.e., at the time of change from the CC charging stage to the CV charging stage) in the CC-CV charging protocol. The cut-off voltage is set to be less than the end-of-charge voltage of the charge cycle.

During the charging process using the CC-CV charging protocol after the cut-off voltage is set, the control unit 120 may perform the CC charging stage until the terminal voltage of the battery reaches the cut-off voltage, and start the CV charging stage when the voltage of the battery reaches the cut-off voltage. That is, since the control unit 120 sets the cut-off voltage based on the result of comparing the representative initial CC capacity ratio with the representative reference CC capacity ratio, the control unit 120 may control the charging process using the CC-CV charging protocol after the diagnosis of the battery.

The operation of adjusting the cut-off voltage by the control unit 120 is performed to increase the life of the battery based on the comparison result between the representative initial CC capacity ratio and the representative reference CC capacity ratio.

As the terminal voltage of the battery increases, the potential of the positive electrode of the battery also increases, and the positive electrode of the battery degrades faster with increasing potential. Accordingly, the lower the cut-off voltage is set according to the comparison result between the representative initial CC capacity ratio and the representative reference CC capacity ratio, the shorter exposure time of the positive electrode of the battery to high potential in the CC charging duration. Accordingly, compared to the charging method using the fixed cut-off voltage, the use of the battery in the high voltage range is limited, thereby preventing or suppressing degradation of the battery.

That is, according to an embodiment of the present disclosure, it may be possible to increase the life of the battery by setting the cut-off voltage of the battery according to a difference between the initial CC capacity ratio and a preset reference CC capacity ratio for predetermined charge cycles.

Meanwhile, the control unit 120 of the battery diagnosis apparatus 100 may include, in hardware, at least one of digital signal processors (DSPs), digital signal processing devices (DSPDs), programmable logic devices (PLDs), field programmable gate arrays (FPGAs), microprocessors or electrical units for performing other functions, and accordingly it may be possible to execute a variety of control logics executed in the present disclosure. Additionally, when the control logics are implemented in software, the control unit 120 may be implemented as a set of program modules. In this instance, the program modules may be stored in the storage unit 130, and executed by the control unit 120. The storage unit 130 may be inside or outside of the control unit 120, and may be connected to the control unit 120 by a variety of known means.

The storage unit 130 may store data or programs necessary for each component of the battery diagnosis apparatus 100 to perform the operation and function or data created in the process of performing the operation and function. The storage unit 130 may include any known information storage means that records, erases, updates and reads data without limitation. For example, the storage unit 130 may include at least one type of computer readable storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM). Additionally, the storage unit 130 may store program codes defining the processes that are executable by the control unit 120.

For example, the storage unit 130 may store a capacity ratio profile showing a change in the reference CC capacity ratio and the initial CC capacity ratio with increasing cycle count. The data acquisition unit 110 may access the storage unit 130 to acquire the capacity ratio profile and set the cut-off voltage for the diagnostic target battery based on the acquired capacity ratio profile. In another example, the data acquisition unit 110 may directly receive the capacity ratio profile from the external device.

To begin with, a change in capacity retention of the battery between the presence and absence of faults causing accelerated degradation will be described with reference to FIG. 2.

Figure 2:
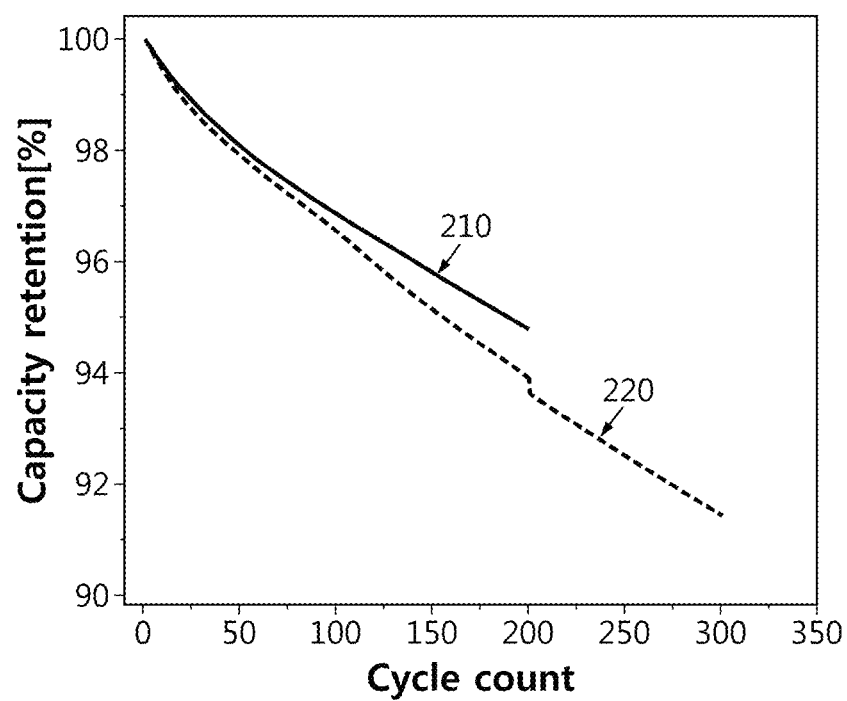
FIG. 2 is a diagram referenced in comparing a trend in capacity retention change in a normal battery without accelerated degradation fault and an abnormal battery with accelerated degradation fault, referenced in various embodiments of the present disclosure.

FIG. 2 is a diagram referenced in comparing a trend in capacity retention change in a normal battery without accelerated degradation fault and an abnormal battery with accelerated degradation fault, referenced in various embodiments of the present disclosure.

The capacity retention may refer to a ratio of a full charge capacity to a design capacity. The design capacity may refer to a preset maximum chargeable capacity at BOL. The full charge capacity may refer to a maximum chargeable capacity when the battery is degraded with use from BOL. That is, the full charge capacity for each charge cycle may be equal to the sum of the charge capacity in the CC charging duration and the charge capacity in the CV charging duration according to the CC-CV charging protocol.

In an example, when the diagnostic target battery is charged from SOC 0% to 100% through the charging process using the CC-CV charging protocol, the control unit 120 may determine the full charge capacity the diagnostic target battery to be equal to the sum of the charge capacity in the CC charging duration and the charge capacity in the CV charging duration. Accordingly, the design capacity is a fixed value, while the full charge capacity is a variable value.

In the embodiment of FIG. 2, the capacity retention of the diagnostic target battery may be generated by the control unit 120 using the battery information acquired from the data acquisition unit 110, and may be acquired by the data acquisition unit 110 via communication.

Referring to FIG. 2, a curve 210 shows a relationship between the cycle count and capacity retention of the normal battery (a reference battery), and a curve 220 shows a relationship between the cycle count and the capacity retention of the abnormal battery (may be the diagnostic target battery).

It can be seen that as the cycle count increases, the capacity retention of the abnormal battery rapidly decreases, and a difference in capacity retention between the two curves 210, 220 gradually increases.

However, a difference in capacity retention between the normal battery and the abnormal battery is very small until the cycle count reaches about 30, and it can be seen from FIG. 2 that early diagnosis of abnormal degradation of the battery from the change in capacity retention is inappropriate.

The rapid decline in capacity retention may represent the occurrence of accelerated degradation accompanying the rapid decline in full charge capacity. Accordingly, it may represent that the abnormal battery degrades faster than the normal battery.

Hereinafter, an embodiment in which the control unit 120 sets the cut-off voltage of the diagnostic target battery will be described in detail.

The control unit 120 may reduce the cut-off voltage for the diagnostic target battery when the CC capacity ratio of the diagnostic target battery determined within a period of time until the cycle count reaches a predetermined value is higher than the CC capacity ratio according to a reference capacity ratio profile.

Figure 3:
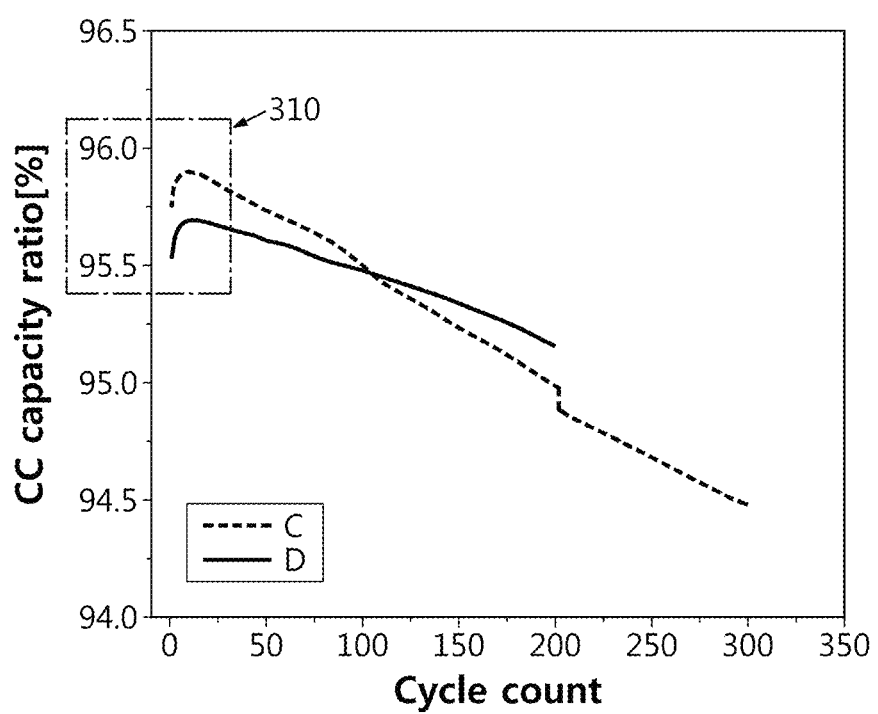
FIG. 3 is a diagram exemplarily showing a profile representing a change in CC capacity ratio of a battery with increasing cycle count of charge cycle referenced in various embodiments of the present disclosure.

FIG. 3 is a diagram exemplarily showing a profile representing a change in CC capacity ratio of the battery with increasing cycle count of charge cycle referenced in various embodiments of the present disclosure.

Referring to FIG. 3 together with FIG. 2, in the graph of FIG. 3, the X axis indicates the cycle count, and the Y axis indicates the CC capacity ratio. The two capacity ratio profiles C, D show a change in the CC capacity ratio of the diagnostic target battery and the reference battery with increasing cycle count, respectively. The reference battery may refer to a normal battery manufactured with the same specification as the diagnostic target battery.

The reference capacity ratio profile D shows a time-dependent change of the CC capacity ratio of the reference battery for 200 repeated charge cycles with the increasing cycle count from 1 to 200. The CC capacity ratio per cycle count of the capacity ratio profile D is a value obtained by dividing the full charge capacity per cycle count of the capacity retention curve 210 of FIG. 2 by the CC charge capacity.

The diagnosis capacity ratio profile C shows a time-dependent change of the CC capacity ratio of the diagnostic target battery for 300 repeated charge cycles. Assume that the diagnosis capacity ratio profile C has the sign of accelerated degradation due to manufacturing defects in the diagnostic target battery or the environment in which the diagnostic target battery is used after it is manufactured. The CC capacity ratio per cycle count of the diagnosis capacity ratio profile C is a value obtained by dividing the full charge capacity per cycle count of the capacity retention curve 220 of FIG. 2 by the CC charge capacity.

The inventors recognized through many experiments and verification that as the diagnostic target battery has higher potential for accelerated degradation, the CC capacity ratio of the diagnostic target battery is larger than that of the reference battery for a period of time during which the cycle count is low, and subsequently, the CC capacity ratio decreases fast with the increasing cycle count.

Referring to FIG. 3, it can be seen that for the diagnostic observation duration before the cycle count of the charge cycle reaches the reference number, the CC capacity ratio of the diagnostic target battery according to the diagnosis capacity ratio profile C is higher than the CC capacity ratio of the reference battery according to the reference capacity ratio profile D. That is, the high initial CC capacity ratio of the diagnostic target battery may represent a high potential for accelerated degradation of the diagnostic target battery.

Figure 4:
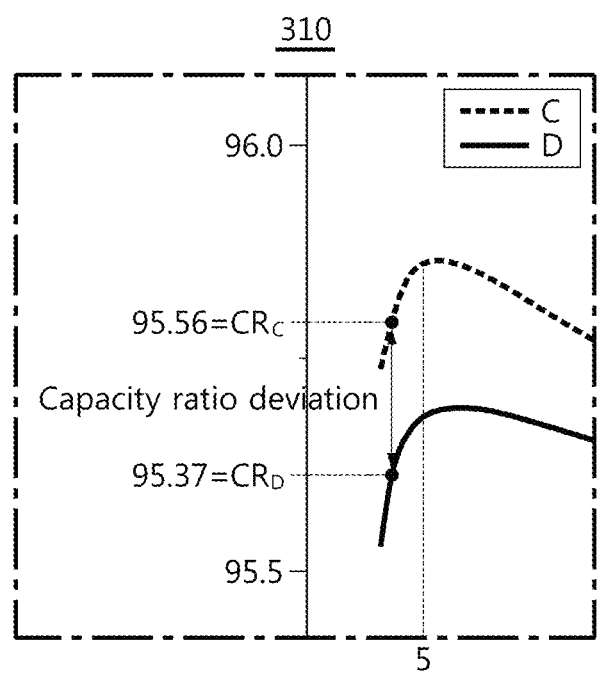
FIG. 4 is an enlarged diagram of a region of interest marked in FIG. 3.

FIG. 4 is an enlarged diagram of a region of interest marked in FIG. 3.

Referring to FIG. 4, the region of interest 310 shows a change in CC capacity ratio of each of the reference battery and the diagnostic target battery for the diagnostic observation duration with the increasing cycle count from 1 to 5 which is the reference number.

The control unit 120 may compare the representative CC capacity ratio (referred to as 'representative initial CC capacity ratio', see $CR_C$) of the diagnostic target battery with the representative CC capacity ratio (referred to as 'representative reference CC capacity ratio', see $CR_D$) of the reference battery in the diagnostic observation duration, and set the cut-off voltage based on the comparison result.

The control unit 120 may calculate a capacity ratio deviation that is a difference between the representative initial CC capacity ratio $CR_C$ of the diagnostic target battery and the representative reference CC capacity ratio $CR_C$ in the diagnostic observation duration.

For example, when the representative initial CC capacity ratio is 95.56%, and the representative reference CC capacity ratio is 95.37%, the control unit 120 may calculate 95.56%−95.37%=0.19% as the capacity ratio deviation.

When the calculation of the capacity ratio deviation is completed, the control unit 120 may set the cut-off voltage based on the capacity ratio deviation. The end-of-charge voltage of the battery may be limited according to the cut-off voltage adjusted based on the capacity ratio deviation. An embodiment in which the control unit 120 adjusts the cut-off voltage of the battery based on the capacity ratio deviation will be described in detail below.

According to an embodiment of the present disclosure, it may be possible to identify the sign of accelerated degradation of the diagnostic target battery at the early stage from the size and/or change of the CC capacity ratio of the diagnostic target battery compared to the reference battery for the diagnostic observation duration, and perform the control operation for preventing the accelerated degradation of the diagnostic target battery according to the sign of accelerated degradation.

Hereinafter, an embodiment in which the control unit 120 sets the cut-off voltage will be described in detail.

According to embodiments, the control unit 120 may set the cut-off voltage to be lower than a preset reference cut-off voltage for the battery by a voltage corresponding to the capacity ratio deviation.

According to embodiments, the control unit 120 may set the cut-off voltage using a reference SOC profile (see FIG. 5) stored in the storage unit 130. It will be described in detail with reference to FIG. 5.

Figure 5:
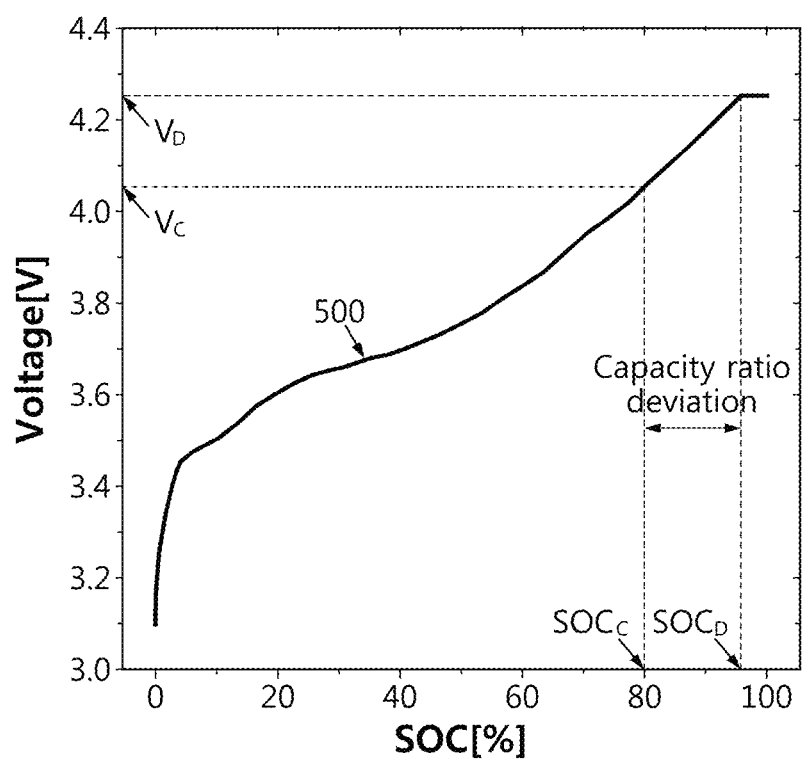
FIG. 5 is a diagram showing a reference SOC profile used in various embodiments of the present disclosure.
Figure 6:
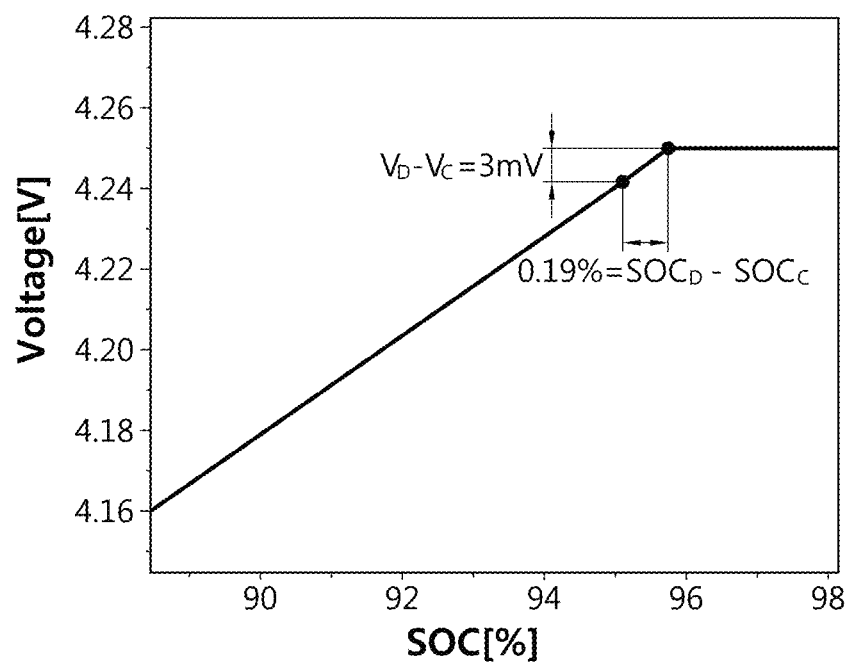
FIG. 6 is an enlarged diagram of a portion of the reference SOC profile shown in FIG. 5.

FIG. 5 is a diagram showing the reference SOC profile used in various embodiments of the present disclosure, and FIG. 6 is an enlarged diagram of a portion of the reference SOC profile shown in FIG. 5.

Referring to FIG. 5, the reference SOC profile 500 shows a correlation between SOC and Closed Circuit Voltage (CCV) for the charge cycles of the reference battery at BOL and may be prepared beforehand and stored in the storage unit 130.

The control unit 120 may determine a target SOC based on the reference SOC corresponding to the reference cut-off voltage and the capacity ratio deviation.

Seeing the reference SOC profile 500, as SOC increases from 0%, CCV increases together, and CCV is kept constant from the time when SOC reaches $SOC_D$ to the time when SOC is 100%. That is, in the reference SOC profile 500, $SOC_D$ indicates the reference SOC that is SOC at the time of change from the CC charging stage to the CV charging stage, and $V_D$ indicates the reference cut-off voltage recorded as CCV at $SOC_D$.

The control unit 120 may set the target SOC ($SOC_C$) based on the reference SOC ($SOC_D$) corresponding to the reference cut-off voltage $V_D$ and the capacity ratio deviation. For example, in the embodiment of FIG. 5, the control unit 120 may set, as the target SOC, $SOC_C$ that is a value obtained by subtracting the capacity ratio deviation from the reference SOC ($SOC_D$).

The control unit 120 may adjust the cut-off voltage to be equal to $V_C$ which is CCV corresponding to the target SOC ($SOC_C$). That is, the cut-off voltage of the diagnostic target battery may be set to be equal to the voltage $V_D$ that is the reference cut-off voltage for the diagnostic observation duration, and after the diagnosis is completed, may be changed to the voltage $V_C$ that is lower than the reference cut-off voltage.

When the cut-off voltage for the diagnostic target battery is reduced from the voltage $V_D$ to the voltage $V_C$, the exposure time of the positive electrode of the diagnostic target battery to high sign of the CC charging duration is shorter than when the cut-off voltage is the constant voltage $V_D$, thereby preventing rapid degradation of the diagnostic target battery.

Hereinafter, another embodiment in which the control unit 120 sets the cut-off voltage will be described.

According to embodiments, the control unit 120 may set the cut-off voltage using a CCV deviation corresponding to the capacity ratio deviation that is a difference between the representative initial CC capacity ratio and the representative reference CC capacity ratio. It will be described in detail using FIG. 6.

FIG. 6 shows that the capacity ratio deviation (equal to a difference between $SOC_D$ and $SOC_C$ in FIG. 5) is 0.19%, and an adjustment amount of the cut-off voltage (equal to a difference between $V_D$ and $V_C$ in FIG. 5) is 3 mV.

According to embodiments, when the representative initial CC capacity ratio is larger than the representative reference CC capacity ratio by the capacity ratio deviation, the control unit 120 may set the target SOC ($SOC_C$) reduced from the reference SOC ($SOC_D$) by the capacity ratio deviation, and set the cut-off voltage by searching for voltage $V_C$ associated with the target SOC ($SOC_C$) from the reference SOC profile 500.

The representative initial CC capacity ratio larger than the representative reference CC capacity ratio represents that the sign of accelerated degradation of the diagnostic target battery is as high as the size of the capacity ratio deviation.

According to an embodiment of the present disclosure, since the control unit 120 sets the cut-off voltage according to the capacity ratio deviation of the diagnostic target battery, it may be possible to reduce the accelerated degradation risk according to the portent level of accelerated degradation of the diagnostic target battery. Furthermore, it may be possible to prevent the cut-off voltage from being set to be unnecessarily low, thereby minimizing the reduction in dischargeable capacity of the diagnostic target battery.

Hereinafter, the process of acquiring the reference profile (D in FIG. 3) will be described with reference to FIG. 7.

Figure 7:
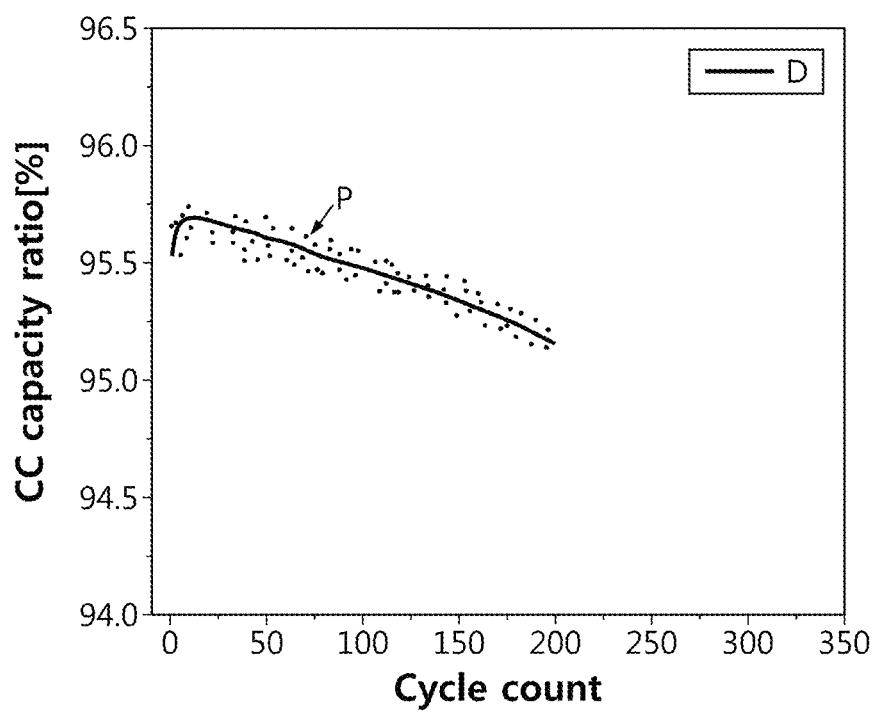
FIG. 7 is a diagram referenced in illustrating a process of acquiring a reference capacity ratio profile referenced in various embodiments of the present disclosure.

FIG. 7 is a diagram referenced in illustrating the process of acquiring the reference capacity ratio profile referenced in various embodiments of the present disclosure.

In the graph of FIG. 7, each data point p indicates the CC capacity ratio of the reference battery per charge cycle, acquired for the repeated charge cycles of the reference battery more than the reference number.

When the reference battery goes through 200 charge cycles, the number of data points p may be 200, and a set of data points may be 'a time-series of the CC capacity ratio'.

The control unit 120 may generate the reference capacity ratio profile D by applying at least one curve fitting algorithm (for example, Least Square Method, polynomials) to the time-series of the CC capacity ratio.

Meanwhile, in the disclosure, the CC capacity ratio of a specific charge cycle refers to a ratio of the CC charge capacity to the total charge capacity. The total charge capacity is equal to the sum of the CC charge capacity (the charge capacity for the CC charging duration) and the CV charge capacity (the charge capacity for the CV charging duration). Accordingly, irrespective of whether the sign of accelerated degradation of the diagnostic target battery was identified, the total charge capacity is larger than the CC charge capacity.

The CC charge capacity may be determined by periodically measuring the charge current during the CC charging stage and accumulating the measured charge current value. Likewise, the CV charge capacity may be determined by periodically measuring the charge current during the CV charging stage, and accumulating the measured charge current value.

The data acquisition unit 110 may acquire the current value of the charge current detected by the current sensor (see reference sign A in FIG. 8). The control unit 120 may determine the CC charge capacity by accumulating the current value included in the battery information acquired for a predetermined number of charge cycles in a preset CC charging voltage range.

In an example, the data acquisition unit 110 may determine the CC charge capacity of the battery to be equal to the cumulative current amount in the CC charging duration by accumulating the current value measured by the current sensor during the CC charging stage of the diagnostic target battery over time.

In another example, the data acquisition unit 110 may determine the CV charge capacity of the battery to be equal to the cumulative current amount in the CV charging duration by accumulating the current value measured by the current sensor during the CV charging stage of the diagnostic target battery over time.

In relation to this, in the CC charging duration, the diagnostic target battery is charged by a preset magnitude of charge current. In contrast, in the CV charging duration, as the cut-off voltage is constantly applied to the diagnostic target battery as the charging voltage, the magnitude of the charge current decreases.

Accordingly, the control unit 120 may set a current measurement cycle in the CV charging duration to be shorter than a current measurement cycle in the CC charging duration. In an example, in the CC charging duration, the charge current may be measured at a first sampling rate (for example, 10 times/sec), and in the CV charging duration, the charge current may be measured at a second sampling rate (for example, 60 times/sec) that is higher than the first sampling rate. Additionally, in the CC charging duration, the terminal voltage of the battery may be measured at a third sampling rate (for example, 60 times/sec), and in the CV charging duration, the terminal voltage of the battery may be measured at a fourth sampling rate (for example, 10 times/sec) that is lower than the third sampling rate.

The control unit 120 may estimate the SOC of the diagnostic target battery based on the cumulative current amount in the CC charging duration or the CV charging duration. Here, the method for estimating the SOC of the battery from the cumulative current amount is well known in the technical field and its detailed description is omitted.

As described above, the control unit 120 may calculate the representative initial CC capacity ratio based on the initial CC capacity ratio per charge cycle for the diagnostic observation duration, and diagnose the accelerated degradation of the diagnostic target battery at the early stage using the representative initial CC capacity ratio.

FIG. 8 is a diagram schematically showing the exemplary setup of a high level equipment including the battery diagnosis apparatus 100 according to an embodiment of the present disclosure.

Referring to FIG. 8, the reference number 1 indicates the high level equipment such as a battery pack or a battery diagnosis system. Hereinafter, for convenience of description, assume that the reference number 1 indicates a battery diagnosis system.

The battery diagnosis system 1 may be equipped with the battery diagnosis apparatus 100 according to the present disclosure. That is, the battery diagnosis system 1 according to the present disclosure may include a battery management system (BMS) 10, a charging/discharging unit 300 and the battery B.

The BMS 10 according to the present disclosure may include the battery diagnosis apparatus 100 and the measurement unit 200. In this configuration, at least some of the components of the battery diagnosis apparatus 100 may be formed by supplementing or adding the functions of the components included in the conventional BMS. For example, the data acquisition unit 110, the control unit 120 and the storage unit 130 of the battery diagnosis apparatus 100 may be the components of the BMS.

The battery B may be the diagnostic target battery described above with reference to FIGS. 1 to 7. Additionally, the battery pack 1 may further include an electrical component (a relay, a fuse or the like) and a case.

The measurement unit 200 may be connected to the voltage sensing line SL1, the voltage sensing line SL2 and the current sensing line SL3.

Specifically, the voltage sensing line SL1 may be connected to the positive terminal of the battery B and the measurement unit 200. Additionally, the voltage sensing line SL2 may be connected to the negative terminal of the battery B and the measurement unit 200. The measurement unit 200 may measure a voltage applied between the voltage sensing line SL1 and the voltage sensing line SL2 as the terminal voltage of the battery B.

Additionally, the measurement unit 200 may measure the charge current and/or the discharge current of the battery B through the current sensor A connected to the third sensing line SL3. For example, the current sensor A may include a shunt resistor or an ammeter.

The charging/discharging unit 300 may be configured to charge and/or discharge the battery B in response to a command from the control unit 120. That is, the charging/discharging unit 300 may have only a charging function, and may have both a charging function and a discharging function. The measurement unit 200 may measure the voltage and current of the battery B while the battery is being charged and/or discharged by the charging/discharging unit 300.

The voltage and current of the battery measured by the measurement unit 200 may be transmitted to the battery diagnosis apparatus 100. Specifically, the data acquisition unit 110 may receive the measurement value of each of the terminal voltage and current of the battery from the measurement unit 200. For example, the data acquisition unit 110 may acquire the current value of the charge current flowing in the battery B measured by the current sensor A through the measurement unit 200.

Figure 9:
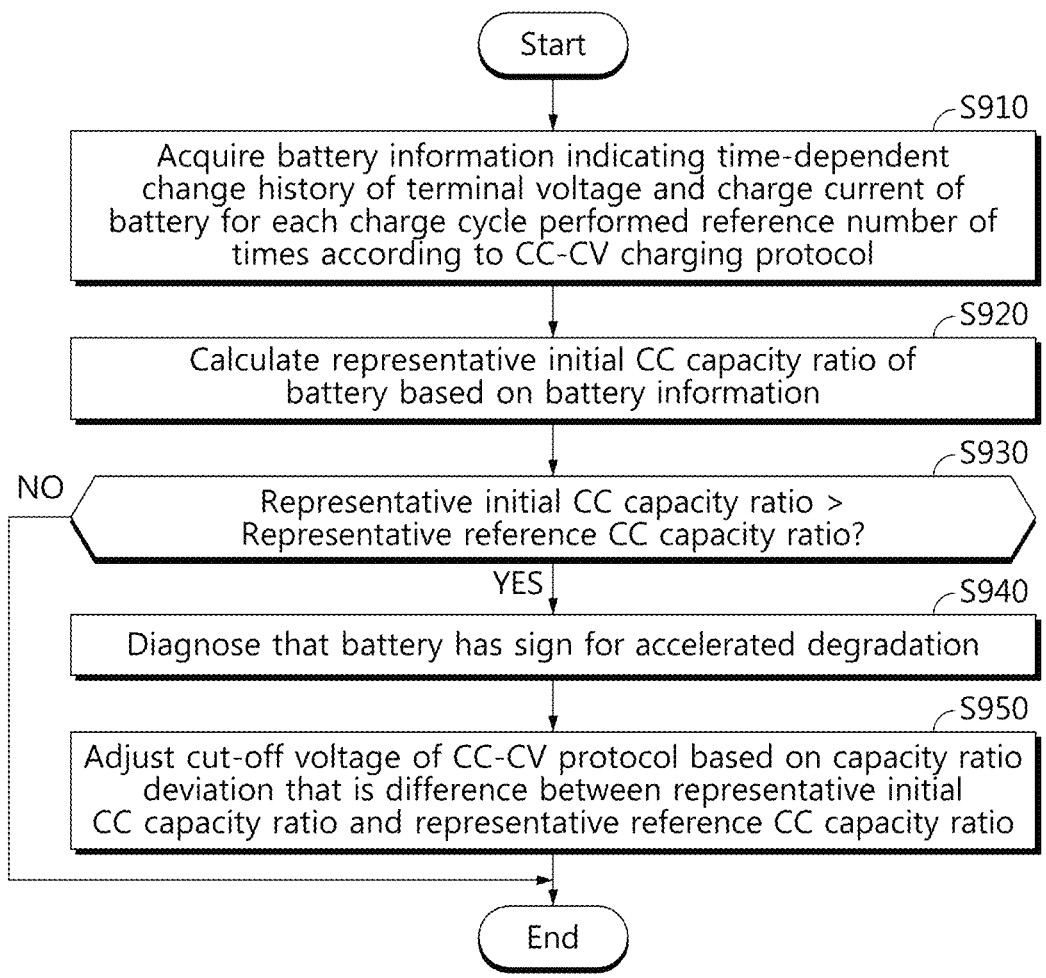
FIG. 9 is a flowchart schematically showing a battery diagnosis method according to another embodiment of the present disclosure.
Figure 10:
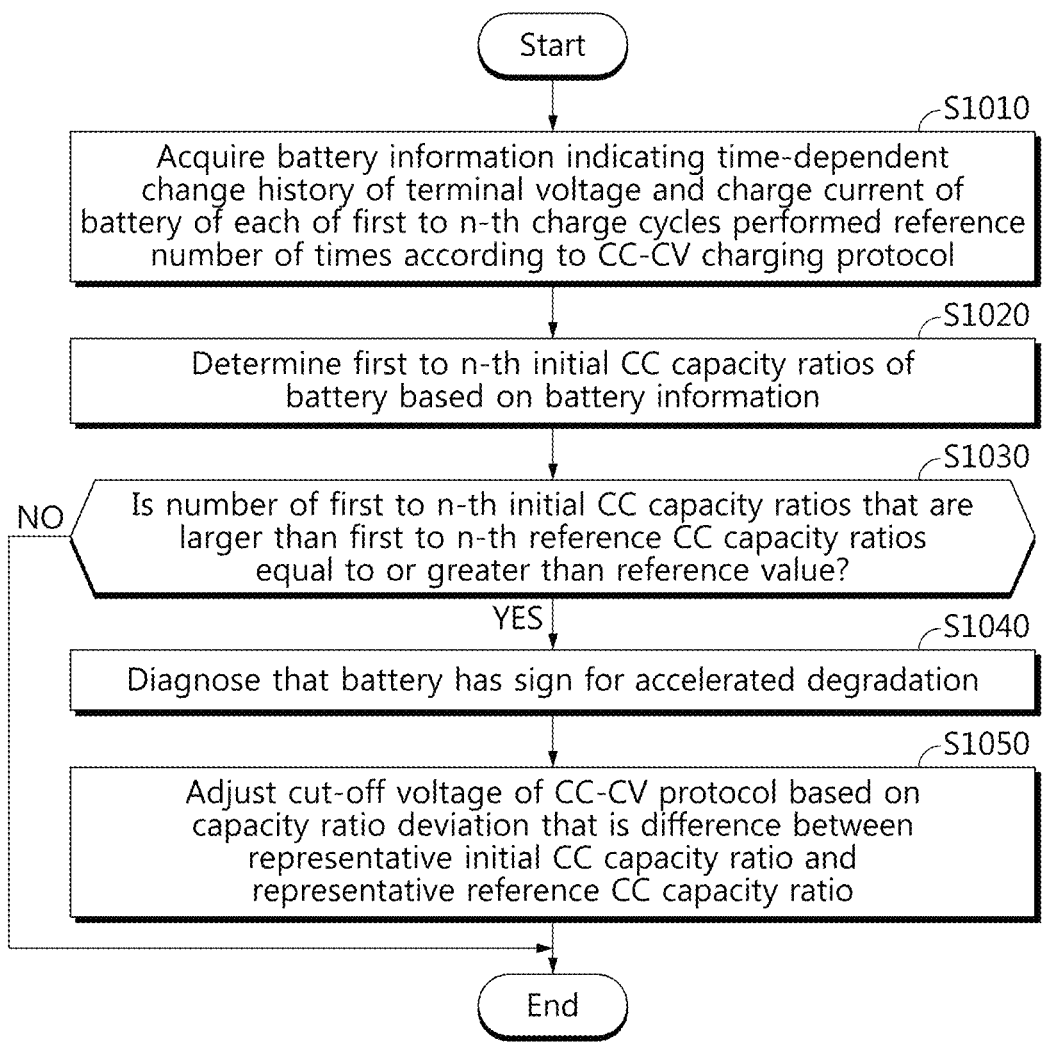
FIG. 10 is a flowchart schematically showing a battery diagnosis method according to another embodiment of the present disclosure.
Figure 11:
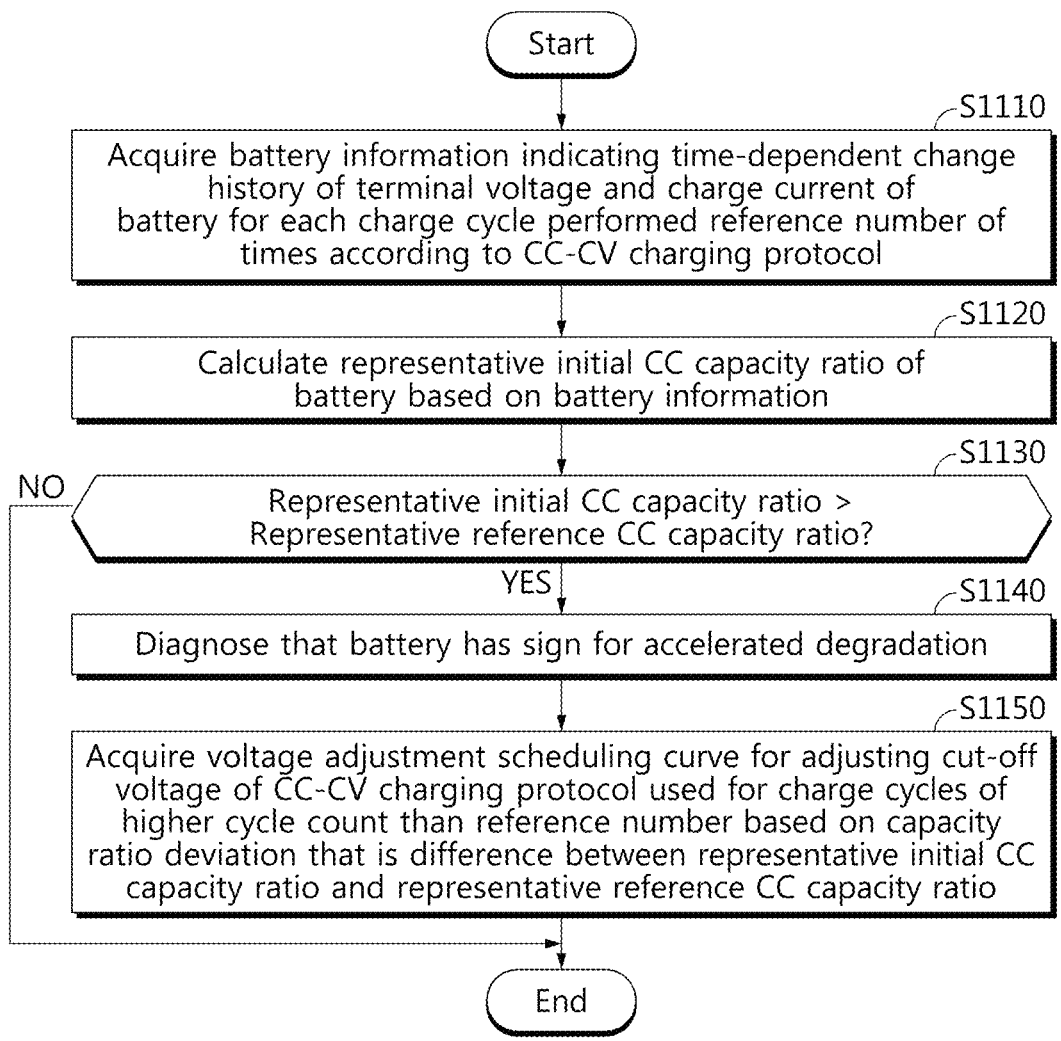
FIG. 11 is a flowchart schematically showing a battery diagnosis method according to another embodiment of the present disclosure.

Hereinafter, embodiments of a battery diagnosis method using the charging capacity information per charge cycle will be described with reference to FIGS. 9 to 11. The battery diagnosis methods according to FIGS. 9 to 11 are performed on the battery B at BOL, and each step may be performed by the battery diagnosis apparatus 100. Hereinafter, overlapping description with the previous description may be omitted.

FIG. 9 is a flowchart schematically showing the battery diagnosis method according to another embodiment of the present disclosure.

The battery diagnosis method according to FIG. 9 may include the steps of acquiring the battery information (S910), calculating the representative initial CC capacity ratio (S920), comparing the representative initial CC capacity ratio with the representative reference CC capacity ratio (S930) and setting the cut-off voltage (S940).

Referring to FIGS. 1 to 8 together with FIG. 9, in the step S910, the control unit 120 acquires, using the data acquisition unit 110, the battery information indicating a time-dependent change history of the terminal voltage and the charge current of the battery B for each charge cycle performed the reference number of times according to the CC-CV charging protocol. The reference number is equal to or greater than 1.

For example, the data acquisition unit 110 may acquire the battery information including the voltage value of the terminal voltage measured through the voltage sensing lines SL1, SL2 connected to the positive electrode and the negative electrode of the battery B and the current value of the charge current measured through the current sensing line SL3.

In step S920, the control unit 120 calculates the representative initial CC capacity ratio of the battery B based on the battery information acquired in the step S910.

The reference number that is the number of charge cycles required to calculate the representative initial CC capacity ratio may be preset.

In an example, in the case where the reference number is 1, the representative initial CC capacity ratio may be set to be equal to the ratio of the CC charge capacity to the total charge capacity in the initial charge cycle of the battery B at BOL.

In another example, in the case where the reference number is n (a natural number of 2 or greater), the battery B at BOL may be charged for n charge cycles, and n initial CC capacity ratios for the n charge cycles may be calculated. In this case, the representative initial CC capacity ratio may be calculated to be equal to the representative value of the n initial CC capacity ratios.

In the step S930, the control unit 120 determines whether the representative initial CC capacity ratio is larger than the representative reference CC capacity ratio by comparing the representative initial CC capacity ratio calculated in the step S920 with the predetermined representative reference CC capacity ratio. Alternatively, the control unit 120 may determine whether the representative initial CC capacity ratio is larger than the representative reference CC capacity ratio by an allowable error or more. The allowable error may be a preset value to prevent misdiagnosis caused by a measurement error present in the current value.

When a value of the step S930 is "YES", step S940 is performed. When the value of the step S930 is "NO", the method according to FIG. 9 may end.

In the step S940, the control unit 120 diagnoses that the battery B has the sign of accelerated degradation.

In the step S950, the control unit 120 adjusts the cut-off voltage of the CC-CV charging protocol based on the capacity ratio deviation that is a difference between the representative initial CC capacity ratio and the representative reference CC capacity ratio.

Specifically, the control unit 120 may determine the target SOC (SOC$_C$) based on the capacity ratio deviation, and may set the cut-off voltage of the battery B to be equal to the voltage (V$_C$) mapped to the target SOC (SOC$_C$) from the reference SOC profile 500.

The cut-off voltage adjusted in the step S940 is used as voltage that is the reference of change event from the CC charging stage to the CV charging stage during the charging process of the battery B using the CC-CV charging protocol after the end of the method according to FIG. 9. That is, the control unit 120 may request the charging/discharging unit 300 to stop CC charging and start the CV charging stage in response to the terminal voltage of the battery B reaching the adjusted cut-off voltage V$_C$ during the CC charging stage afterwards.

FIG. 10 is a flowchart schematically showing a battery diagnosis method according to another embodiment of the present disclosure.

Referring to FIGS. 1 to 8 together with FIG. 10, in step S1010, the control unit 120 acquires, using the data acquisition unit 110, the battery information indicating the time-dependent change history of the terminal voltage and the charge current of the battery B of each of the first to n-th charge cycles performed the reference number according to the CC-CV charging protocol. n indicates the reference number, and this embodiment is different from the embodiment according to FIG. 9 in that the reference number n in the step S1010 is 2 or greater.

In step S1020, the control unit 120 determines the first to n-th initial CC capacity ratios of the battery B based on the battery information acquired in the step S1010. For example, when i is a natural number of n or smaller, the i-th initial CC capacity ratio is a ratio of the CC charge capacity to the total charge capacity in the i-th charge cycle (i.e., the cycle count=i).

In step S1030, the control unit 120 determines whether the number of the first to n-th initial CC capacity ratios that are larger than first to n-th reference CC capacity ratios is equal to or greater than a reference value by comparing the first to n-th initial CC capacity ratios calculated in the step S1020 with the first to n-th reference CC capacity ratios.

When i is a natural number of n or smaller, the i-th reference CC capacity ratio is the CC capacity ratio mapped to the cycle count=i in the reference capacity ratio profile D shown in FIG. 3. Here, each initial CC capacity ratio is compared with one reference CC capacity ratio mapped to the cycle count that is equal thereto. That is, where i=1~n, determination may be made as to whether the i-th initial CC capacity ratio is larger than the i-th reference CC capacity ratio. The reference value may be preset to be equal to or smaller than the reference number.

In an example, in FIG. 3, the diagnosis capacity ratio profile C is located higher than the reference capacity ratio profile D in a range in which the cycle count is equal to or smaller than 100. Accordingly, the reference value is equal to the reference number, and a value of the step S1030 is "YES".

When the value of the step S1030 is "YES", step S1040 is performed. When the value of the step S1030 is "NO", the method according to FIG. 10 may end.

In step S1040, the control unit 120 diagnoses that the battery B has the sign of accelerated degradation.

In step S1050, the control unit 120 adjusts the cut-off voltage of the CC-CV charging protocol based on the capacity ratio deviation that is a difference between the representative initial CC capacity ratio that is the representative value of the first to n-th initial CC capacity ratios and the representative value of the representative reference CC capacity ratio. The representative reference CC capacity ratio may be the representative value of the first to n-th reference CC capacity ratios.

Figure 12:
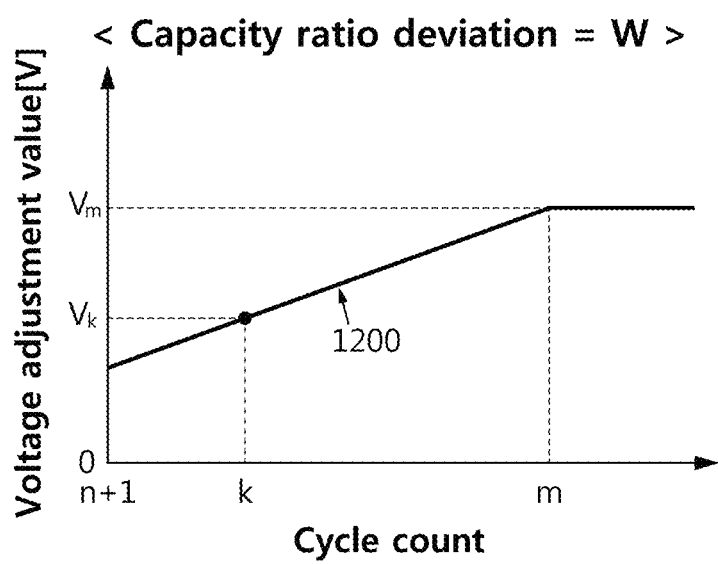
FIG. 12 is a diagram referenced in illustrating the battery diagnosis method of FIG. 11.

FIG. 11 is a flowchart schematically showing a battery diagnosis method according to another embodiment of the present disclosure, and FIG. 12 is a diagram referenced in illustrating the battery diagnosis method of FIG. 11.

Referring to FIGS. 1 to 8 together with FIG. 11, in step S1110, the control unit 120 acquires, using the data acquisition unit 110, the battery information indicating the time-dependent change history of the terminal voltage and the charge current of the battery B for each charge cycle performed the reference number of times according to the CC-CV charging protocol. The step S1110 is substantially the same as the step S910 of FIG. 9.

In step S1120, the control unit 120 calculates the representative initial CC capacity ratio of the battery B based on the battery information acquired in the step S1110. The step S1120 is substantially the same as the step S920 of FIG. 9.

In step S1130, the control unit 120 determines whether the representative initial CC capacity ratio calculated in the step S1120 is larger than the representative reference CC capacity ratio. The step S1130 is substantially the same as the step S930 of FIG. 9.

When a value of the step S1130 is "YES", step S1140 is performed. When the value of the step S1130 is "NO", the method according to FIG. 11 may end.

In the step S1140, the control unit 120 diagnoses that the battery B has the sign of accelerated degradation. The step S1140 is substantially the same as the step S940 of FIG. 9.

In step S1150, the control unit 120 acquires a voltage adjustment scheduling curve for adjusting the cut-off voltage of the CC-CV charging protocol used for the charge cycles of higher cycle count than the reference number based on the capacity ratio deviation that is a difference between the initial CC capacity ratio and the predetermined reference CC capacity ratio.

The storage unit 130 may store a plurality of voltage adjustment scheduling curves associated with a plurality of preset capacity ratio deviations in a one-to-one relationship. Each voltage adjustment scheduling curve defines a change in voltage adjustment value with the increasing cycle count to n+1 or greater, and may be recorded in the storage unit 130 in the form of a lookup table (a data map) or a function.

Referring to FIG. 12, the graph showing the voltage adjustment scheduling curve 1200 shows an exemplary relationship between the cycle count and the voltage adjustment value when the capacity ratio deviation is a specific value W. Since the reference number is n, the graph of FIG. 12 shows the cycle count in the range of n+1 or greater.

Before the cycle count reaches a threshold count m from n+1, the voltage adjustment value may have a positive correlation with the cycle count. After the cycle count reaches the threshold count m, the voltage adjustment value may be maintained at a predetermined upper limit value $V_m$. The upper limit value $V_m$ may be a preset value to prevent the prolonged CV charging duration and the reduced dischargeable capacity of the battery B due to too low cut-off voltage.

The control unit 120 may select any one voltage adjustment scheduling curve associated with the capacity ratio deviation calculated in the step S1140 from the storage unit 130, and set (update) the cut-off voltage of the CC-CV charging protocol using the selected voltage adjustment scheduling curve each time the cycle count increases in the range of n+1 or greater.

When the capacity ratio deviation is determined as W in the step S1150, the control unit 120 may acquire the voltage adjustment scheduling curve 1200 associated with the W among the plurality of capacity ratio deviations from the storage unit 130, and determine the voltage adjustment value in the charge cycles of the cycle count of n+1 or greater from the voltage adjustment scheduling curve 1200.

In an example, when the cycle count is k, the control unit 120 may set the cut-off voltage to be equal to the voltage $(V_D-V_k)$ that is the product of subtracting the voltage adjustment value $V_k$ from the reference cut-off voltage (see $V_D$ in FIG. 5). Accordingly, during the charge cycle of the cycle count of k, the change event from the CC charging stage to the CV charging stage may occur when the terminal voltage of the battery reaches the voltage $(V_D-V_k)$.

That is, the battery diagnosis method according to FIG. 11 is different from the battery diagnosis method according to FIGS. 9 and 10 in that the cut-off voltage of the CC-CV charging protocol is changed according to the cycle count of the charge cycle afterwards.

The battery diagnosis methods according to FIGS. 9 to 11 may identify the sign of accelerated degradation of the battery B at the early stage, and change the cut-off voltage to prevent accelerated degradation of the battery B.

The embodiments of the present disclosure described hereinabove are not embodied only through the apparatus and method, and may be implemented through programs that perform functions corresponding to the exemplary configurations of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspect of the present disclosure and the scope of the appended claims and their equivalents.

Additionally, as many substitutions, modifications and changes may be made to the present disclosure described hereinabove by those skilled in the art without departing from the technical aspect of the present disclosure, the present disclosure is not limited by the above-described embodiments and the accompanying drawings, and some or all of the embodiments may be selectively combined to allow various modifications.

What is claimed is:
1. A battery diagnosis apparatus, comprising:
a data acquisition unit configured to acquire battery information indicating a time-dependent change history of a terminal voltage and a charge current of a battery for each charge cycle performed a reference number of times for the battery at beginning of life (BOL) according to a Constant Current (CC)-Constant Voltage (CV) charging protocol; and
a control unit configured to calculate an initial CC capacity ratio for each charge cycle performed the reference number of times based on the battery information,
wherein the initial CC capacity ratio in a specific charge cycle is a ratio of a CC charge capacity to a total charge capacity of the battery in the specific charge cycle, and the CC charge capacity is a charge capacity in a CC charging duration according to the CC-CV charging protocol, and
wherein the control unit is configured to:
determine a representative initial CC capacity ratio based on the initial CC capacity ratio for each charge cycle, and diagnose whether the battery has sign of accelerated degradation by comparing the representative initial CC capacity ratio with a predetermined representative reference CC capacity ratio.

2. The battery diagnosis apparatus according to claim 1, wherein the control unit is configured to diagnose that the battery has sign of accelerated degradation when the representative initial CC capacity ratio is larger than the predetermined representative reference CC capacity ratio.

3. The battery diagnosis apparatus according to claim 1, wherein the control unit is configured to adjust a cut-off voltage of the CC-CV charging protocol in response to the battery being diagnosed to have sign of accelerated degradation, and
wherein the cut-off voltage is a voltage which is a reference for a change event from a CC charging stage to a CV charging stage.

4. The battery diagnosis apparatus according to claim 3, wherein the control unit is configured to:
in response to the battery being diagnosed to have sign of accelerated degradation, calculate a capacity ratio deviation indicating a difference between the representative initial CC capacity ratio and the representative reference CC capacity ratio, and
adjust the cut-off voltage based on the capacity ratio deviation.

5. The battery diagnosis apparatus according to claim 4, wherein the control unit is configured to:
determine a target SOC based on a reference State Of Charge (SOC) and the capacity ratio deviation, wherein the reference SOC is mapped to a reference cut-off voltage recorded in a predetermined reference SOC profile indicating a correlation between SOC and Closed Circuit Voltage (CCV), and
adjust the cut-off voltage to be equal to the CCV mapped to the target SOC in the reference SOC profile.

6. The battery diagnosis apparatus according to claim 5, wherein the control unit is configured to determine the target SOC by subtracting the capacity ratio deviation from the reference SOC.

7. The battery diagnosis apparatus according to claim 1, wherein the control unit is configured to calculate the representative initial CC capacity ratio to be equal to an average or a median of a same number of initial CC capacity ratios as the reference number when the reference number is 2 or greater.

8. The battery diagnosis apparatus according to claim 1, wherein the control unit is configured to, for each charge cycle,
determine the CC charge capacity by accumulating a current value of the charge current for the CC charging duration according to the CC-CV charging protocol,
determine a CV charge capacity by accumulating a current value of the charge current for a CV charging duration according to the CC-CV charging protocol, and
determine the total charge capacity by summing the CC charge capacity and the CV charge capacity.

9. The battery diagnosis apparatus according to claim 1, wherein the control unit is configured to:
in response to the battery being diagnosed to have sign of accelerated degradation, calculate a capacity ratio deviation indicating a difference between the representative initial CC capacity ratio and the representative reference CC capacity ratio,
select any one voltage adjustment scheduling curve associated with the calculated capacity ratio deviation from a plurality of preset voltage adjustment scheduling curves associated with a plurality of capacity ratio deviations in a one-to-one relationship, wherein each voltage adjustment scheduling curve defines a change in voltage adjustment value with increasing cycle count, and
determine the cut-off voltage of the CC-CV charging protocol using the selected voltage adjustment scheduling curve each time the cycle count of the charge cycle increases, and
wherein the cut-off voltage is a voltage which is a reference for a change event from a CC charging stage to a CV charging stage.

10. A battery diagnosis system comprising the battery diagnosis apparatus according to claim 1.

11. A battery diagnosis method, comprising:
acquiring battery information indicating a time-dependent change history of a terminal voltage and a charge current of a battery for each charge cycle performed a reference number of times for the battery at beginning of life (BOL) according to a Constant Current (CC)-Constant Voltage (CV) charging protocol;
calculating an initial CC capacity ratio for each charge cycle performed the reference number of times based on the battery information, wherein the initial CC capacity ratio in a specific charge cycle is a ratio of a CC charge capacity to a total charge capacity of the battery in the specific charge cycle, and the CC charge capacity is a charge capacity in a CC charging duration according to the CC-CV charging protocol;
determining a representative initial CC capacity ratio based on the initial CC capacity ratio for each charge cycle; and
diagnosing whether the battery has sign of accelerated degradation by comparing the representative initial CC capacity ratio with a predetermined representative reference CC capacity ratio.

12. The battery diagnosis method according to claim 11, wherein the diagnosing whether the battery has sign of accelerated degradation comprises diagnosing that the battery has sign of accelerated degradation when the representative initial CC capacity ratio is larger than the predetermined representative reference CC capacity ratio.

13. The battery diagnosis method according to claim 11, further comprising:
adjusting a cut-off voltage of the CC-CV charging protocol in response to the battery being diagnosed to have sign of accelerated degradation,
wherein the cut-off voltage is a voltage which is a reference for a change event from a CC charging stage to a CV charging stage.

14. The battery diagnosis method according to claim 13, wherein the adjusting of the cut-off voltage of the CC-CV charging protocol comprises:
in response to the battery being diagnosed to have sign of accelerated degradation, calculating a capacity ratio deviation indicating a difference between the representative initial CC capacity ratio and the representative reference CC capacity ratio; and
adjusting the cut-off voltage based on the capacity ratio deviation.

15. The battery diagnosis method according to claim 14, wherein the adjusting of the cut-off voltage based on the capacity ratio deviation comprises:
determining a target SOC based on a reference State Of Charge (SOC) and the capacity ratio deviation, wherein the reference SOC is mapped to a reference cut-off voltage recorded in a predetermined reference SOC profile indicating a correlation between SOC and Closed Circuit Voltage (CCV); and adjusting the cut-off voltage to the equal to the CCV mapped to the target SOC in the reference SOC profile.

* * * * *